United States Patent
Wang et al.

(10) Patent No.: US 11,257,955 B2
(45) Date of Patent: Feb. 22, 2022

(54) THIN FILM TRANSISTOR, ARRAY SUBSTRATE, AND METHOD FOR FABRICATING THE SAME

(71) Applicants: BOE Technology Group Co., Ltd., Beijing (CN); Hefei Xinsheng Optoelectronics Technology Co., Ltd., Anhui (CN)

(72) Inventors: Qinghe Wang, Beijing (CN); Luke Ding, Beijing (CN); Leilei Cheng, Beijing (CN); Jun Bao, Beijing (CN); Tongshang Su, Beijing (CN); Dongfang Wang, Beijing (CN); Guangcai Yuan, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 288 days.

(21) Appl. No.: 16/026,307

(22) Filed: Jul. 3, 2018

(65) Prior Publication Data

US 2019/0081178 A1  Mar. 14, 2019

(30) Foreign Application Priority Data

Sep. 13, 2017  (CN) .......................... 201710821855.4

(51) Int. Cl.
*H01L 29/786* (2006.01)
*H01L 27/12* (2006.01)
(Continued)

(52) U.S. Cl.
CPC .... *H01L 29/78606* (2013.01); *H01L 21/0212* (2013.01); *H01L 21/0272* (2013.01);
(Continued)

(58) Field of Classification Search
CPC .......... H01L 27/1288; H01L 29/66765; H01L 29/66545; H01L 29/7869;
(Continued)

(56) References Cited

U.S. PATENT DOCUMENTS 6,689,211 B1 * 2/2004 Wu .................... H01L 21/30608
117/915
7,645,413 B2 * 1/2010 Song .................... G03F 7/0002
264/319
(Continued)

*Primary Examiner* — Allen L Parker
*Assistant Examiner* — Charles N Ausar-El
(74) *Attorney, Agent, or Firm* — Arent Fox LLP; Michael Fainberg

(57) ABSTRACT

The disclosure provides a thin film transistor, an array substrate, and a method for fabricating the same. An embodiment of the disclosure provides a method for fabricating a thin film transistor, the method including: forming a gate, a gate insulation layer, and an active layer above an underlying substrate successively; forming a patterned hydrophobic layer above the active layer, wherein the hydrophobic layer includes first pattern components, and orthographic projections of the first pattern components onto the underlying substrate overlap with a orthographic projection of a channel area at the active layer onto the underlying substrate; and forming a source and a drain above the hydrophobic layer, wherein the source and the drain are located respectively on two sides of a channel area, and in contact with the active layer.

5 Claims, 3 Drawing Sheets

(51) Int. Cl.
*H01L 29/66* (2006.01)
*H01L 21/02* (2006.01)
*H01L 29/24* (2006.01)
*H01L 29/45* (2006.01)
*H01L 29/49* (2006.01)
*H01L 21/027* (2006.01)
*H01L 29/16* (2006.01)
*H01L 51/00* (2006.01)
*H01L 51/10* (2006.01)

(52) U.S. Cl.
CPC ........ *H01L 21/0273* (2013.01); *H01L 27/127* (2013.01); *H01L 27/1225* (2013.01); *H01L 27/1259* (2013.01); *H01L 27/1288* (2013.01); *H01L 29/1606* (2013.01); *H01L 29/24* (2013.01); *H01L 29/45* (2013.01); *H01L 29/4908* (2013.01); *H01L 29/66969* (2013.01); *H01L 29/7869* (2013.01); *H01L 51/0023* (2013.01); *H01L 51/105* (2013.01)

(58) Field of Classification Search
CPC .......... H01L 21/02118–0212; H01L 29/78606; H01L 21/0212; H01L 21/0272; H01L 21/0273; H01L 27/1225; H01L 27/1259; H01L 27/127; H01L 29/1606; H01L 29/24; H01L 29/45; H01L 29/4908; H01L 29/66969; H01L 51/0023
See application file for complete search history.

(56) References Cited

U.S. PATENT DOCUMENTS

| | | | |
|---|---|---|---|
| 9,793,268 B2 * | 10/2017 | Su | H01L 29/66795 |
| 2005/0243268 A1 * | 11/2005 | Nisato | G02F 1/13394 |
| | | | 349/201 |
| 2005/0287719 A1 * | 12/2005 | Ryu | H01L 27/283 |
| | | | 438/149 |
| 2009/0321739 A1 * | 12/2009 | Kim | H01L 29/78696 |
| | | | 257/59 |
| 2014/0061635 A1 * | 3/2014 | Liu | H01L 29/66765 |
| | | | 257/43 |
| 2014/0183523 A1 * | 7/2014 | Endo | H01L 29/7869 |
| | | | 257/43 |
| 2014/0329056 A1 * | 11/2014 | Hou | H01L 51/0003 |
| | | | 428/195.1 |
| 2015/0024530 A1 * | 1/2015 | Lee | H01L 29/66477 |
| | | | 438/34 |
| 2015/0056761 A1 * | 2/2015 | Wu | H01L 27/1288 |
| | | | 438/158 |
| 2015/0102332 A1 * | 4/2015 | Shin | H01L 51/5259 |
| | | | 257/40 |
| 2016/0365361 A1 * | 12/2016 | Jiang | H01L 29/66969 |
| 2017/0222168 A1 * | 8/2017 | Ikeda | H01L 29/78696 |
| 2017/0271381 A1 * | 9/2017 | Sone | G09G 3/2092 |
| 2018/0133687 A1 * | 5/2018 | Chung | B32B 27/308 |
| 2019/0360041 A1 * | 11/2019 | Wu | B82Y 30/00 |

* cited by examiner

THIN FILM TRANSISTOR, ARRAY SUBSTRATE, AND METHOD FOR FABRICATING THE SAME

CROSS-REFERENCE TO RELATED APPLICATION

This application claims priority of Chinese Patent Application No. 201710821855.4, filed on Sep. 13, 2017, which is hereby incorporated by reference in its entirety.

FIELD

The present disclosure relates to the field of display technologies, and particularly to a thin film transistor, an array substrate, and a method for fabricating the same.

BACKGROUND

Flat Panel Displays (FPDs) have become predominant in the market, and also there are more and more types of flat panel displays, e.g., a Liquid Crystal Display (LCD), an Organic Light-Emitting Diode (OLED) display, a Plasma Display Panel (PDP), a Field Emission Display (FED), etc.

SUMMARY

An embodiment of the disclosure provides a method for fabricating a thin film transistor, the method including:
  forming a gate, a gate insulation layer, and an active layer above an underlying substrate successively;
  forming a patterned hydrophobic layer above the active layer, wherein the hydrophobic layer includes first pattern components, and orthographic projections of the first pattern components onto the underlying substrate overlap with an orthographic projection of a channel area at the active layer onto the underlying substrate; and
  forming a source and a drain above the hydrophobic layer, wherein the source and the drain are located respectively on two sides of a channel area, and in contact with the active layer.

Optionally, the hydrophobic layer further includes second pattern components, orthographic projections of the second pattern components onto the underlying substrate overlap with orthographic projections of first areas at the active layer onto the underlying substrate, and the first areas are the other areas on the two sides of the channel area than areas where the source and the drain are arranged.

Optionally, the forming the patterned hydrophobic layer above the active layer includes:
  forming a patterned photoresist layer with a first preset thickness above the active layer, wherein the pattern of the photoresist layer is complementary to the pattern of the hydrophobic layer;
  forming a hydrophobic thin film with a second preset thickness above the patterned photoresist layer, wherein the second preset thickness is smaller than the first preset thickness; and
  stripping away the patterned photoresist layer using photoresist stripping liquid, and also removing the hydrophobic thin film, above the patterned photoresist layer, in contact with the photoresist layer, thus forming the patterned hydrophobic layer.

Optionally, the forming the patterned hydrophobic layer above the active layer includes: forming a patterned hydrophobic layer of an all-fluorin polymer above the active layer.

Optionally, the forming the gate, the gate insulation layer, and the active layer above the underlying substrate successively includes:
  forming an aluminum/molybdenum metal thin film above the underlying substrate, and patterning the aluminum/molybdenum metal thin film into the gate;
  forming a silicon dioxide thin film above the gate, and etching the silicon dioxide thin film into the gate insulation layer; and
  forming an indium gallium zinc oxide thin film above the gate insulation layer, and forming the patterned active layer; and
  the forming the source and the drain above the hydrophobic layer includes: forming a molybdenum/aluminum/molybdenum metal thin film above the hydrophobic layer, and patterning the molybdenum/aluminum/molybdenum metal thin film into the source and the drain.

Optionally, the forming the patterned hydrophobic layer above the active layer includes: forming a patterned hydrophobic layer of Hexamethyl Disilazane (HMDS) above the active layer.

Optionally, the forming the gate, the gate insulation layer, and the active layer successively above the underlying substrate includes:
  forming a graphene thin film above the underlying substrate, and patterning the graphene thin film into the gate;
  forming a Polyvinyl Pyrrolidone (PVP) thin film above the gate, and etching the PVP thin film into the gate insulation layer; and
  forming a pentacene thin film above the gate insulation layer, and forming the patterned active layer; and
  the forming the source and the drain above the hydrophobic layer includes: forming a graphene thin film above the patterned hydrophobic layer, and patterning the graphene thin film into the source and the drain.

An embodiment of the disclosure further provides a thin film transistor fabricated using the method for fabricating a thin film transistor according to any one of the embodiments above of the disclosure, the thin film transistor including:
  the gate, the gate insulation layer, and the active layer arranged above the underlying substrate successively;
  the patterned hydrophobic layer arranged above the active layer, wherein the pattern of the hydrophobic layer includes the first pattern components, and the orthographic projections of the first pattern components onto the underlying substrate 1 overlap with the orthographic projection of the channel area at the active layer onto the underlying substrate; and; and
  the source and the drain arranged above the hydrophobic layer, wherein the source and the drain are located respectively on the two sides of the channel area, and in contact with the active layer.

Optionally, the material of the hydrophobic layer is an all-fluorin polymer or Hexamethyl Disilazane (HMDS).

An embodiment of the disclosure further provides an array substrate including the thin film transistors according to any one of the embodiments above of the disclosure.

Advantageous effects of the embodiments of the disclosure are as follows: in the embodiments of the disclosure, the patterned hydrophobic layer is formed above the active layer after the active layer is formed, so that the active layer can be isolated from ambient humidity and oxygen due to the hydrophobicity of the hydrophobic layer to thereby form a more stable interface of the channel area at the active layer so as to improve the stability of the thin film transistor; and also the patterned hydrophobic layer formed above the active layer can avoid the etchant liquid from contacting the active layer while the source and the drain are being subsequently formed through etching, to thereby prevent the active layer from being damaged, so as to protect the active layer.

DETAILED DESCRIPTION OF THE EMBODIMENTS

Figure 1:
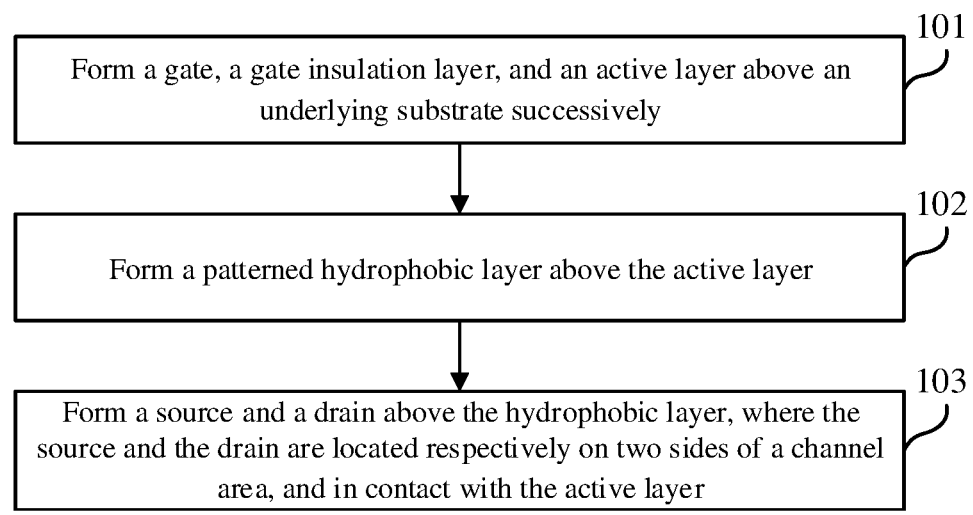
FIG. 1 is a flow chart of a method for fabricating a thin film transistor according to an embodiment of the disclosure.

Implementations of the embodiments of the disclosure will be described below in details with reference to the drawings. It shall be noted that reference numerals identical or like throughout the specification refer to identical or like elements, or elements with identical or like functions. The embodiments to be described below with reference to the drawings are exemplary, and merely intended to illustrate the disclosure, but not to limit the disclosure thereto.

Referring to FIG. 1, an embodiment of the disclosure provides a method for fabricating a thin film transistor, where the method includes the following steps.

The step 101 is to form a gate, a gate insulation layer, and an active layer above an underlying substrate successively.

In different applications of the thin film transistor, the underlying substrate can be a glass substrate, or can be a flexible substrate including a humidity and oxygen isolation layer, and optionally the flexible substrate can be made of a material which is poly(ethylene 2,6-naphthalenedi-carboxylate), Polyethylene terephthalate (PET) or polyimide.

Optionally, a metal thin film of the gate can be made of a single film layer of any one of an aluminum thin film, a copper thin film, a molybdenum thin film, a titanium thin film, a silver thin film, a gold thin film, a tantalum thin film, a tungsten thin film, a chrome thin film, and an aluminum alloy thin film, or a compound film layer of at least two of them.

Optionally, the gate insulation layer can be made of a single layer of a silicon oxide thin film, a silicon nitride thin film, an alumina thin film, a tantalic oxide thin film, or a ytterbium oxide thin film, or a compound film layer of at least two of them.

Optionally, the active layer can be made of metal oxide including at least one of In, Zn, Ga, and Sn, or for an organic thin film transistor, the active layer can be made of pentacene.

The step 102 is to form a patterned hydrophobic layer above the active layer, where the hydrophobic layer includes first pattern components, and orthographic projections of the first pattern components onto the underlying substrate overlap with an orthographic projection of a channel area at the active layer onto the underlying substrate. In an optional implementation, in order to isolate the other area at the active layer than the channel area from humidity and oxygen, the hydrophobic layer can further include second pattern components, where orthographic projections of the second pattern components onto the underlying substrate overlap with orthographic projections of first areas at the active layer onto the underlying substrate, and the first areas are the other areas on the two sides of the channel area than areas where the source and the drain are arranged. Optionally, the hydrophobic layer can be a hydrophobic layer including fluorin or silicon.

Optionally, forming the patterned hydrophobic layer above the active layer includes followings.

Forming a patterned photoresist layer with a first preset thickness above the active layer, where the pattern of the photoresist layer is complementary to the pattern of the hydrophobic layer.

Forming a hydrophobic thin film with a second preset thickness above the patterned photoresist layer, where the second preset thickness is smaller than the first preset thickness.

Stripping away the patterned photoresist layer using photoresist stripping liquid, and also removing the hydrophobic thin film, above the patterned photoresist layer, in contact with the photoresist layer, thus forming the patterned hydrophobic layer.

Since the thickness of the photoresist layer is larger than the thickness of the hydrophobic thin film, the photoresist layer can be stripped away using the photoresist stripping liquid while the stripping liquid sufficiently contacts the photoresist layer to facilitate removal of the photoresist layer, the hydrophobic thin film attached above the photoresist layer can be further removed, and the other hydrophobic thin film can be reserved, thus forming the patterned hydrophobic layer.

The step 103 is to form a source and a drain above the hydrophobic layer, where the source and the drain are located respectively on two sides of a channel area, and in contact with the active layer. Since the hydrophobic layer is patterned, that is, there is the hydrophobic layer above the channel area at the active layer, and there is no hydrophobic layer in areas, on the two sides of the channel area, where the source and the drain are arranged, so the source and the drain can come into contact with the active layer when thin films of the source and the drain are formed above the hydrophobic layer.

In an optional implementation, forming the patterned hydrophobic layer above the active layer includes: forming a patterned hydrophobic layer of an all-fluorin polymer above the active layer.

Optionally, forming the gate, the gate insulation layer, and the active layer above the underlying substrate successively can include: forming an aluminum/molybdenum metal thin film above the underlying substrate, and patterning it into the gate; forming a silicon dioxide thin film above the gate, and etching the silicon dioxide thin film into the gate insulation layer; and forming an indium gallium zinc oxide thin film above the gate insulation layer, and forming the patterned active layer; and furthermore forming the source and the drain above the hydrophobic layer includes: forming a molybdenum/aluminum/molybdenum metal thin film above the hydrophobic layer, and patterning the molybdenum/aluminum/molybdenum metal thin film into the source and the drain.

In an optional implementation, forming the patterned hydrophobic layer above the active layer includes: forming a patterned hydrophobic layer of Hexamethyl Disilazane (HMDS) above the active layer.

Optionally, forming the gate, the gate insulation layer, and the active layer above the underlying substrate successively can include: forming a graphene thin film above the underlying substrate, and patterning the grapheme thin film into the gate; forming a Polyvinyl Pyrrolidone (PVP) thin film above the gate, and etching the PVP film into the gate insulation layer; and forming a pentacene thin film above the gate insulation layer, and patterning the pentacene thin film into the active layer; and furthermore forming the source and the drain above the hydrophobic layer includes: forming a graphene thin film above the patterned hydrophobic layer, and patterning the graphene thin film into the source and the drain.

In order to describe the method for fabricating a thin film transistor according to the embodiment of the disclosure in further details, it will be exemplify below with reference to FIG. 2 to FIG. 6.

The method for fabricating a thin film transistor according to embodiments of the disclosure includes followings.

Figure 2:
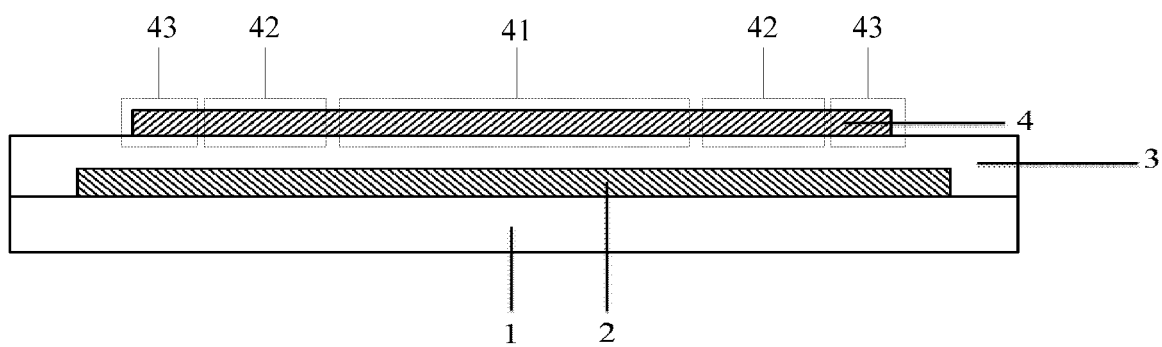
FIG. 2 is a schematic structural diagram of the thin film transistor according to the embodiment of the disclosure in which a gate, a gate insulation layer, and an active layer are fabricated.

The first step is to spray an Al/Mo (Al: 30 nm, Mo: 250 nm) metal thin film above an underlying substrate 1, and to pattern the Al/Mo metal thin film into a gate 2, where the underlying substrate optionally can be made of glass; to deposit a 500 nm SiO2 thin film through chemical deposition, and to etch the SiO2 thin film into a gate insulation layer 3; and to spray a 500 nm IGZO thin film above the gate insulation layer 3, and to pattern the IGZO thin film into an active layer 4. It shall be noted that the active layer 4 generally includes a channel area 41, and the thin film transistor generally includes a source and a drain, arranged on two sides of the channel area 41 at the active layer 4, in contact with the active layer, that is, the active layer 4 further includes second areas 42 in contact with the source and the drain, and the other areas on the two sides of the channel area 41 than the second area 42 in contact with the source and the drain can be referred to as first areas 43. FIG. 2 illustrates a schematic structural diagram of the thin film transistor with the active layer formed above the underlying substrate.

Figure 3:
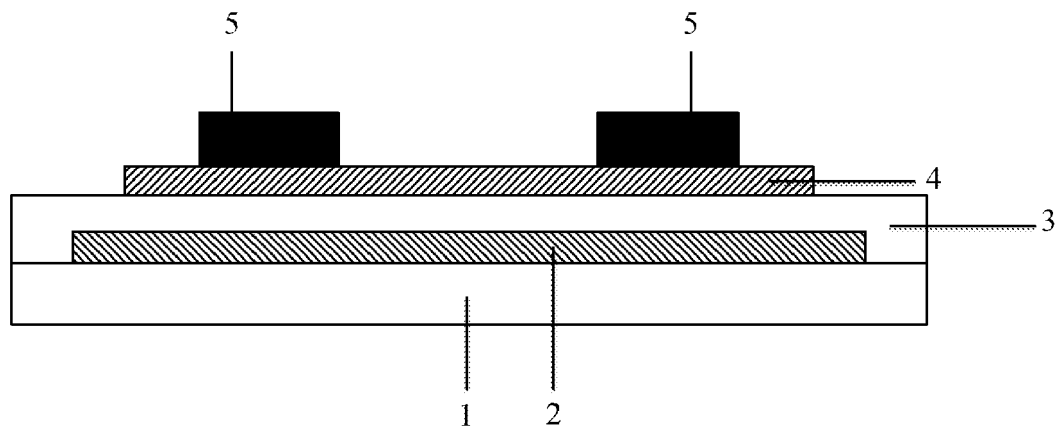
FIG. 3 is a schematic structural diagram of the thin film transistor according to the embodiment of the disclosure in which a patterned photoresist layer is fabricated.

The second step is to coat positive photoresist (PR) with a thickness of 2.5 micrometers above the active layer 4, and to expose and develop the PR into a patterned photoresist layer 5, where the pattern of the photoresist layer is used to form the pattern of a hydrophobic layer to be complementary to the pattern of the photoresist layer, the pattern of the photoresist layer shall be complementary to the pattern of the hydrophobic layer. Furthermore the pattern of the hydrophobic layer is used to shield the channel area at the active layer, or the first area of the channel area, that is, not to shield areas at the active layer where the source and the drain are arranged, so optionally a orthographic projection of the pattern of the photoresist layer onto the underlying substrate shall overlap with orthographic projections, of the areas where the source and the drain are arranged, onto the underlying substrate. FIG. 3 illustrates a schematic structural diagram of the thin film transistor with the photoresist layer formed above the active layer.

Figure 4:
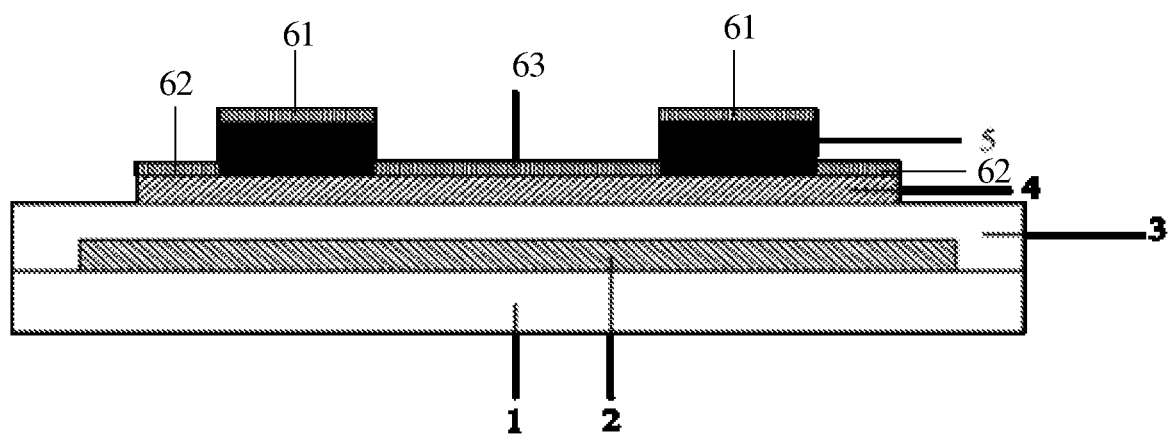
FIG. 4 is a schematic structural diagram of the thin film transistor according to the embodiment of the disclosure in which a hydrophobic thin film is fabricated.

The third step is to spray an all-fluorin polymer (CYTOP) with a thickness of 100 nm through solution spraying, and to thermally treat the CYTOP at 180⌊ to cure it into a stable hydrophobic thin film, where the hydrophobic thin film includes third pattern components 63 located above and in contact with the photoresist layer 5, first pattern components 61 (corresponding to the channel area at the active layer) located between two third pattern components 63, and second pattern components 62, located at the respective third pattern components, away from the first pattern components 61. FIG. 4 illustrates a schematic structural diagram of the thin film transistor with the hydrophobic thin film formed above the photoresist layer.

Figure 5:
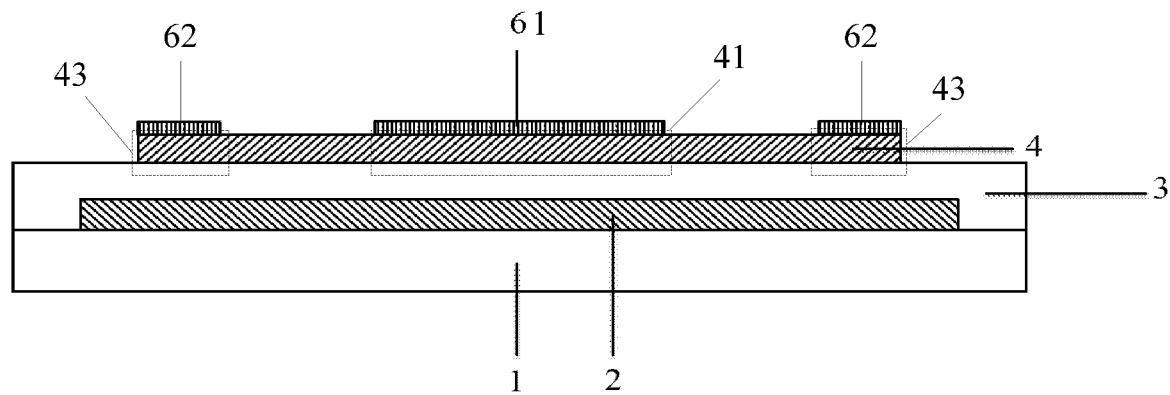
FIG. 5 is a schematic structural diagram of the thin film transistor according to the embodiment of the disclosure in which the photoresist layer is removed.

The fourth step is to strip away the photoresist layer using photoresist stripping liquid, and to remove the hydrophobic thin film above the photoresist layer 5 in contact with the photoresist layer, i.e., the first hydrophobic components 61, thus resulting the patterned hydrophobic layer 6, that is, the hydrophobic layer includes the first pattern components 61 and the second pattern components 62, where orthographic projections of the first pattern components 61 onto the underlying substrate 1 overlap with orthographic projections of the channel area 41 at the active layer 4 onto the underlying substrate 1, and orthographic projections of the second pattern components 62 onto the underlying substrate 1 overlap with orthographic projections of the first areas 41 at the active layer 4 onto the underlying substrate 1; and the first areas 43 are the other areas, on the two sides of the channel area 42, than areas where the source and the drain are arranged. FIG. 5 illustrates a schematic structural diagram of the thin film transistor formed with the patterned hydrophobic layer.

Figure 6:
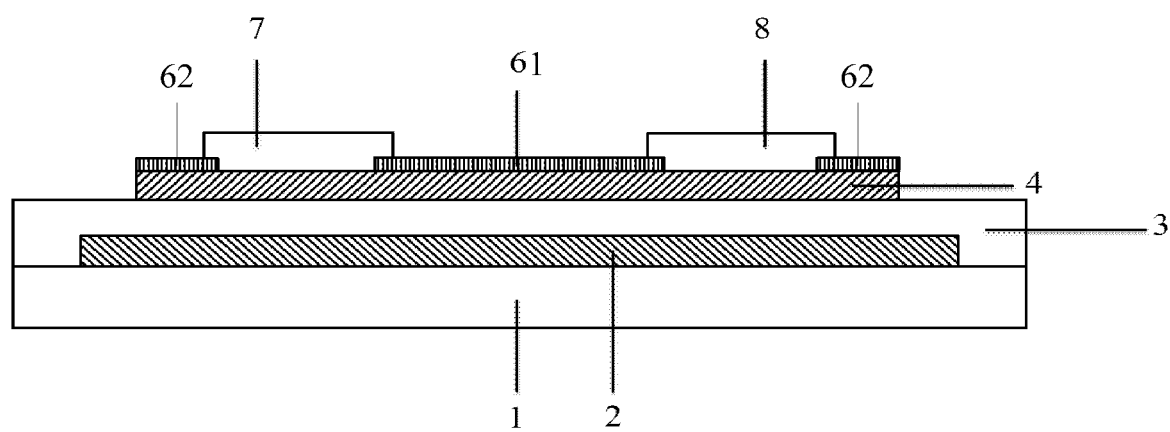
FIG. 6 is a schematic structural diagram of the thin film transistor according to the embodiment of the disclosure in which a source and a drain are fabricated.

The fifth step is to form a Mo/Al/Mo (Mo: 30 nm, Al: 50 nm, Mo: 30 nm) film on the surface through vapor-plating or spraying, and to etch Mo/Al/Mo film using metal etchant liquid into a source 7 and a drain 8 of the thin film transistor. FIG. 6 illustrates a schematic structural diagram of the thin film transistor formed with the source and the drain.

The method for fabricating a thin film transistor according to other embodiments of the disclosure includes followings.

The first step is to pattern-transfer a graphene thin film above an underlying substrate 1, and to pattern graphene thin film into a gate 2, where the graphene thin film optionally can be fabricated through CVD (Graphene), and the underlying substrate optionally can be a Polyethylene terephthalate (PET) underlying substrate; to coat a polyvinyl pyrrolidone (PVP) thin film with a thickness of 400 nm using solution, and to etch PVP thin film into a gate insulation layer 3; and to fabricate an organic semiconductor layer of pentacene, and to pattern the organic semiconductor layer into an active layer 4. FIG. 2 illustrates a schematic structural diagram of the thin film transistor with the active layer formed above the underlying substrate.

The second step is to coat negative photoresist with a thickness of 2.5 micrometers above the active layer, and to expose and develop negative photoresist into a patterned photoresist layer 5. FIG. 3 illustrates a schematic structural diagram of the thin film transistor with the photoresist layer formed above the active layer.

The third step is to spray Hexamethyl Disilazane (HMDS) with a thickness of 100 nm through solution spraying, and to thermally treat it at 100° C. to cure it into a stable hydrophobic thin film, where the hydrophobic thin film includes third pattern components 63 located above and in contact with the photoresist layer 5, first pattern components 61 (corresponding to the channel area at the active layer) located between two third pattern components 63, and second pattern components 62, located at the respective third pattern components, away from the first pattern components 61. FIG. 4 illustrates a schematic structural diagram of the thin film transistor with the hydrophobic thin film formed above the photoresist layer.

The fourth step is to strip away the photoresist layer using photoresist stripping liquid, and to remove the hydrophobic thin film above the photoresist layer in contact with the photoresist layer, thus resulting the patterned hydrophobic layer, that is, the hydrophobic layer includes the first pattern components 61 and the second pattern components 62, where orthographic projections of the first pattern components 61 onto the underlying substrate 1 overlap with orthographic projections of the channel area 41 at the active layer 4 onto the underlying substrate 1, and orthographic projections of the second pattern components 62 onto the underlying substrate 1 overlap with orthographic projections of the first areas 41 at the active layer 4 onto the underlying substrate 1; and the first areas 43 are the other areas, on the two sides of the channel area 42, than areas where the source and the drain are arranged. FIG. 5 illustrates a schematic structural diagram of the thin film transistor formed with the patterned hydrophobic layer.

The fifth step is to pattern-transfer the graphene thin film onto the PET underlying substrate, and to pattern the graphene thin film into a source 7 and a drain 8. FIG. 6 illustrates a schematic structural diagram of the thin film transistor formed with the source and the drain.

It shall be noted that the schematic structural diagrams in other embodiments of the disclosure are substantially the same as those in embodiments of the disclosure except that the materials of the respective film layers, and their formation processes in other embodiments of the disclosure are different from those in embodiments of the disclosure, which have been described above in details, so a repeated description thereof will be omitted here.

Referring to FIG. 6, an embodiment of the disclosure further provides a thin film transistor fabricated using the method for fabricating a thin film transistor according to any one of the embodiments above of the disclosure, where the thin film transistor includes followings.

The gate 2, the gate insulation layer 3, and the active layer 4 arranged above the underlying substrate 1 successively.

The patterned hydrophobic layer arranged above the active layer 4, where the pattern of the hydrophobic layer includes the first pattern components, and the orthographic projections of the first pattern components 61 onto the underlying substrate 1 overlap with the orthographic projection of the channel area at the active layer 4 onto the underlying substrate 1; and in an optional implementation, the hydrophobic layer can further include the second pattern components 62, where the orthographic projections of the second pattern components 62 onto the underlying substrate 1 overlap with the orthographic projections of the first areas at the active layer 4 onto the underlying substrate 1, and the first areas are the other areas on the two sides of the channel area 42 than areas where the source and the drain are arranged.

The source 7 and the drain 8 arranged above the hydrophobic layer, where the source 7 and the drain 8 are located respectively on the two sides of the channel area 42, and in contact with the active layer 4.

Optionally, the material of the hydrophobic layer is an all-fluorin polymer or Hexamethyl Disilazane (HMDS).

An embodiment of the disclosure further provides an array substrate including the thin film transistor according to the embodiment above of the disclosure.

Advantageous effects of the embodiments of the disclosure are as follows: in the embodiments of the disclosure, the patterned hydrophobic layer is formed above the active layer after the active layer is formed, so that the active layer can be isolated from ambient humidity and oxygen due to the hydrophobicity of the hydrophobic layer to thereby form a more stable interface of the channel area at the active layer so as to improve the stability of the thin film transistor; and also the patterned hydrophobic layer formed above the active layer can avoid the etchant liquid from contacting the active layer while the source and the drain are being subsequently formed through etching, to thereby prevent the active layer from being damaged, so as to protect the active layer.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A method for fabricating a thin film transistor, the method comprising:
   forming a gate, a gate insulation layer, and an active layer on an underlying substrate successively;
   forming a patterned hydrophobic layer directly connected with the active layer, wherein the patterned hydrophobic layer comprises first pattern components, and orthographic projections of the first pattern components onto the underlying substrate completely overlap with an orthographic projection of a channel area at the active layer onto the underlying substrate; and
   forming a source and a drain above the patterned hydrophobic layer, wherein the source and the drain are located respectively on two sides of a channel area, and in contact with the active layer;
   wherein the patterned hydrophobic layer further comprises second pattern components, orthographic projections of the second pattern components onto the underlying substrate completely overlap with orthographic projections of first areas at the active layer onto the underlying substrate, and the first areas are other areas on the two sides of the channel area than areas where the source and the drain are arranged;
   wherein the forming the patterned hydrophobic layer directly connected with the active layer comprises:
   forming a patterned photoresist layer with a first preset thickness above second areas of the active layer, wherein the pattern of the patterned photoresist layer is complementary to the pattern of the patterned hydrophobic layer, and the second areas are on the two sides of the channel area where the source and the drain are arranged;
   forming a hydrophobic thin film with a second preset thickness above the patterned photoresist layer, wherein the second preset thickness is smaller than the first preset thickness; and
   stripping away the patterned photoresist layer using photoresist stripping liquid, and also removing the hydrophobic thin film, above the patterned photoresist layer, in contact with the patterned photoresist layer, thus forming the patterned hydrophobic layer.

2. The method according to claim 1, wherein the forming the patterned hydrophobic layer directly connected with the active layer comprises: forming the patterned hydrophobic layer of an all-fluorin polymer above the active layer.

3. The method according to claim 2, wherein the forming the gate, the gate insulation layer, and the active layer on the underlying substrate successively comprises:

forming an aluminum/molybdenum metal thin film above the underlying substrate, and patterning the aluminum/molybdenum metal thin film into the gate;

forming a silicon dioxide thin film above the gate, and etching the silicon dioxide thin film into the gate insulation layer; and forming an indium gallium zinc oxide thin film above the gate insulation layer, and patterning the indium gallium zinc oxide thin film into the active layer; and the forming the source and the drain above the patterned hydrophobic layer comprises:

forming a molybdenum/aluminum/molybdenum metal thin film above the patterned hydrophobic layer, and patterning the molybdenum/aluminum/molybdenum metal thin film into the source and the drain.

4. The method according to claim 1, wherein the forming the patterned hydrophobic layer directly connected with the active layer comprises: forming a patterned hydrophobic layer of Hexamethyl Disilazane (HMDS) above the active layer.

5. The method according to claim 4, wherein the forming the gate, the gate insulation layer, and the active layer on the underlying substrate successively comprises:

forming a graphene thin film above the underlying substrate, and patterning the graphene thin film into the gate;

forming a Polyvinyl Pyrrolidone (PVP) thin film above the gate, and etching the PVP thin film into the gate insulation layer; and forming a pentacene thin film above the gate insulation layer, and patterning the pentacene thin film into the active layer; and the forming the source and the drain above the patterned hydrophobic layer comprises:

forming a graphene thin film above the patterned hydrophobic layer, and patterning the graphene thin film into the source and the drain.

* * * * *